US 10,778,370 B2

United States Patent
Sarkis et al.

(10) Patent No.: US 10,778,370 B2
(45) Date of Patent: Sep. 15, 2020

(54) COMMUNICATION TECHNIQUES INVOLVING POLAR CODEWORDS WITH REDUCED REPETITION

(71) Applicant: QUALCOMM Incorporated, San Diego, CA (US)

(72) Inventors: Gabi Sarkis, San Diego, CA (US); Jing Jiang, San Diego, CA (US); Joseph Binamira Soriaga, San Diego, CA (US); Bilal Sadiq, Basking Ridge, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 93 days.

(21) Appl. No.: 16/017,233

(22) Filed: Jun. 25, 2018

(65) Prior Publication Data

US 2018/0375612 A1 Dec. 27, 2018

Related U.S. Application Data

(60) Provisional application No. 62/525,124, filed on Jun. 26, 2017.

(51) Int. Cl.
*H03M 13/00* (2006.01)
*H04L 1/00* (2006.01)
(Continued)

(52) U.S. Cl.
CPC .......... *H04L 1/0058* (2013.01); *H03M 13/13* (2013.01); *H04L 1/0041* (2013.01);
(Continued)

(58) Field of Classification Search
CPC ... H04L 1/0041; H04L 1/0057; H04L 1/0061; H04L 1/0045; H04L 1/0058; H03M 13/13; H03M 13/09
(Continued)

(56) References Cited

U.S. PATENT DOCUMENTS

2011/0255631 A1 10/2011 Pi et al.
2016/0079999 A1* 3/2016 Shen ..................... H04L 1/0041
714/758
(Continued)

OTHER PUBLICATIONS

Coherent Logix Inc: "UE ID Insertion for Early Block Discrimination on DCI Blind Detection", 3GPP Draft; R1-1711570 UE_ID Insertion for Early Block Discrimination on DCI Blind Detection, 3rd Generation Partnership Project (3GPP), Mobile Competence Centre; 650, Route Des Lucioles; F-06921 Sophia-Antipolis Cedex; France, vol. RAN WG1, No. Qingdao; Jun. 27, 2017-Jun. 30, 2017 Jun. 20, 2017, XP051305823, Retrieved from the Internet: URL:http://www.3gpp.org/ftp/tsg_ran/WG1_RL1/TSGR1_AH/NR_AH_1706/Docs/ [retrieved on—Jun. 20, 2017], 5 pages.
(Continued)

*Primary Examiner* — Christine T. Tu
(74) *Attorney, Agent, or Firm* — Kevin M. Donnelly; Patterson + Sheridan, L.L.P.

(57) ABSTRACT

Certain aspects of the present disclosure provide techniques for an improved encoder for reducing repetition in polar codewords. An apparatus for wireless communication is provided. The apparatus includes at least one processor. The at least one processor is coupled with a memory. The at least one processor includes at least one encoder circuit configured to encode a set of information bits based on a cyclic redundancy check (CRC)-aided polar code to produce a codeword including polar encoded information bits and CRC bits. The at least one encoder circuit is configured to place one or more of the CRC bits at a start of the codeword and to set a value of the one or more CRC bits to a non-zero value. The apparatus includes a transmitter configured to transmit the codeword in accordance with a wireless technology across a channel via one or more antenna elements situated proximate the transmitter.

30 Claims, 10 Drawing Sheets

(51) Int. Cl.
*H03M 13/13* (2006.01)
*H03M 13/09* (2006.01)

(52) U.S. Cl.
CPC .......... *H04L 1/0057* (2013.01); *H04L 1/0061* (2013.01); *H03M 13/09* (2013.01); *H04L 1/0045* (2013.01)

(58) Field of Classification Search
USPC .......................... 714/758, 752, 746, 753, 755
See application file for complete search history.

(56) References Cited

U.S. PATENT DOCUMENTS

| | | | |
|---|---|---|---|
| 2018/0076923 A1* | 3/2018 | Wu | H03M 13/09 |
| 2019/0319745 A1* | 10/2019 | Pan | H04L 1/0041 |

OTHER PUBLICATIONS

Huawei et al., "Discussion on SS Burst Set Composition and SS Block Time Index Indication", 3GPP Draft; R1-1705052, 3rd Generation Partnership Project (3GPP), Mobile Competence Centre; 650, Route Des Lucioles; F-06921 Sophia-Antipolis Cedex; France, vol. RAN WG1, No. Spokane, USA; Apr. 3, 2017-Apr. 7, 2017 Apr. 2, 2017, XP051243183, Retrieved from the Internet: URL:http://www.3gpp.org/ftp/Meetings_3GPP_SYNC/RAN1/Docs/ [retrieved on Apr. 2, 2017], 9 pages.

Huawei et al., "Time Index Indication", 3GPP Draft; R1-1709913, 3rd Generation Partnership Project (3GPP), Mobile Competence Centre; 650, Route Des Lucioles; F-06921 Sophia-Antipolis Cedex; France, vol. RAN WG1, No. Qingdao, China; Jun. 27, 2017-Jun. 30, 2017 Jun. 17, 2017, XP051304653, Retrieved from the Internet: URL:http://www.3gpp.org/ftp/tsg_ran/WG1_RL1/TSGR1_AH/NR_AH_1706/Docs/ [retrieved on—Jun. 17, 2017], 3 pages.

International Search Report and Written Opinion—PCT/US2018/039519—ISA/EPO—dated Oct. 24, 2018.

Song W., et al., "Low-Complexity Segmented CRC-Aided SC Stack Decoder for Polar Codes", 2016 50th Asilomar Conference on Signals, Systems and Computers, IEEE, Nov. 6, 2016, pp. 1189-1193, XP033072790, DOI: 10.1109/ACSSC.2016.7869560 [retrieved on Mar. 2, 2017].

* cited by examiner ered, and CRC bits. The method

COMMUNICATION TECHNIQUES INVOLVING POLAR CODEWORDS WITH REDUCED REPETITION

CROSS-REFERENCE TO RELATED APPLICATION & PRIORITY CLAIM

This application claims benefit of and priority to U.S. Provisional Patent Application Ser. No. 62/525,124, filed Jun. 26, 2017, herein incorporated by reference in its entirety as if fully set forth below and for all applicable purposes.

TECHNICAL FIELD

Aspects of the present disclosure relate to wireless communications, and more particularly, to communication techniques applying and involving polar codewords with reduced repetition. Implementation of the techniques can be done by providing an improved encoder or decoder for using polar codes. Aspects can include new modules (e.g., hardware) having a new encoder and/ordecoder configured for leveraging reduced repetition in polar codewords to implicitly signal additional information, reduce false cyclic redundancy check (CRC) pass determinations, resolve ambiguity of aggregation levels for transmissions, and for advantageous hardware processing.

INTRODUCTION

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

In some examples, a wireless multiple-access communication system may include a number of base stations (BSs), which are each capable of simultaneously supporting communication for multiple communication devices, otherwise known as user equipments (UEs). In an LTE or LTE-A network, a set of one or more base stations may define an eNodeB (eNB). In other examples (e.g., in a next generation, a new radio (NR), or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., which may be referred to as a BS, 5G NB, next generation NodeB (gNB or gNodeB), transmission reception point (TRP), etc.). A BS or DU may communicate with a set of UEs on downlink channels (e.g., for transmissions from a BS or DU to a UE) and uplink channels (e.g., for transmissions from a UE to BS or DU).

These multiple access technologies have been adopted in various telecommunication standards to provide a common protocol that enables different wireless devices to communicate on a municipal, national, regional, and even global level. NR (e.g., new radio or 5G) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

However, as the demand for mobile broadband access continues to increase, there exists a need for further improvements in NR and LTE technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Aspects of the present disclosure provide improved communication devices with new, improved hardware components capable of carrying out new, improved encoding/decoding and signaling techniques. Encoders and decoders according to aspects of the present disclosure can include features as discussed below for leveraging cyclic redundancy check (CRC) aided polar coding techniques. Aspects can include polar encoder/decoder circuitry comprising circuit features configured to carry out encoding and decoding techniques efficiently and considering device size and operational design considerations. Technical improvements can include faster hardware processing resulting from encoding/decoding and signaling using polar codewords having reduced repetition.

Certain aspects provide an apparatus for wireless communication. The apparatus generally includes at least one processor coupled with a memory and comprising at least one encoder circuit. The at least one encoder circuit is configured to encode a set of information bits based on a cyclic redundancy check (CRC)-aided polar code to produce a codeword including polar encoded information bits and CRC bits. The at least one encoder circuit is configured to place one or more of the CRC bits at a start of the codeword and set a value of the one or more CRC bits to a non-zero value. The apparatus includes a transmitter configured to transmit the codeword in accordance with a wireless technology across a channel via one or more antenna elements situated proximate the transmitter.

Certain aspects provide a method for wireless communication. The method generally includes encoding, with encoding circuitry, a set of information bits based on a CRC-aided polar code to produce a codeword comprising polar encoded information bits and CRC bits. The method includes placing one or more of the CRC bits at a start of the codeword and setting a value of the one or more CRC bits to a non-zero value. The method includes transmitting the codeword in accordance with a wireless technology across a channel via one or more antenna elements situated proximate a transmitter.

Certain aspects provide an apparatus for wireless communication. The apparatus generally includes means for encoding a set of information bits based on a CRC-aided polar code to produce a codeword comprising polar encoded information bits and CRC bits. The apparatus includes means for placing one or more of the CRC bits at a start of the codeword and means for setting a value of the one or more CRC bits to a non-zero value. The method includes means for transmitting the codeword in accordance with a wireless technology across a channel.

Certain aspects provide a computer readable medium. The computer readable medium generally includes computer executable code stored thereon for wireless communication. The computer executable code includes code for encoding a set of information bits based on a CRC-aided polar code to produce a codeword including polar encoded information bits and CRC bits. The computer executable code includes code for placing one or more of the CRC bits at a start of the codeword and code for setting a value of the one or more CRC bits to a non-zero value. The computer executable code includes code for transmitting the codeword in accordance with a wireless technology across a channel.

Certain aspects can include a number of devices capable of communication. For example, some aspects may include user-based, handheld consumer devices that comprise a housing capable of holding internal circuitry. The internal circuitry can include one or more processors configured to carry out mobile communications and associated memory for storing data and software. The internal circuitry can also include wireless modem features that include encoder/decoder circuitry that may use polar codes, such CA-polar codes, for encoding or decoding information in wireless communication settings. In another example, an apparatus can comprise: a transceiver capable of wireless communications with at least one network node of a wireless network; and a processor coupled to the transceiver. The processor can comprise an encoder capable of encoding data to provide encoded data by performing operations comprising: encoding the data with a polar code having reduced repetition. The processor can comprise a decoder capable of decoding data to provide decoded data by performing operations comprising: decoding data with a polar code having reduced repetition.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
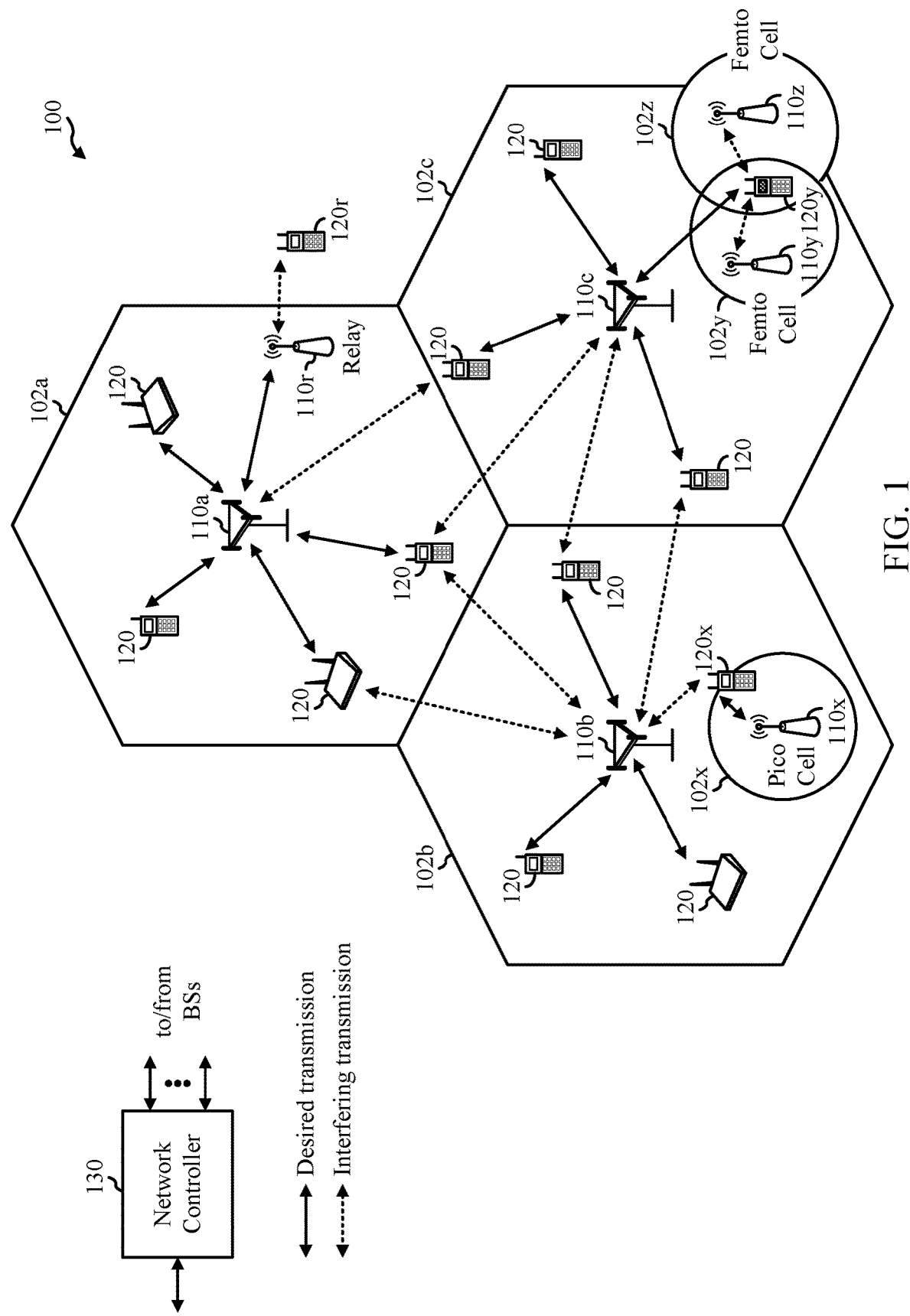
FIG. 1 is a block diagram conceptually illustrating an example telecommunications system, in accordance with certain aspects of the present disclosure.

Aspects of the present disclosure provide apparatus, methods, processing systems, and computer readable mediums for reducing repetition in polar codes.

In certain systems, such as new radio (NR) or 5G systems, polar coding is used for encoding and decoding of certain signals, channels, etc. As discussed in more detail herein, polar codes may have naturally occurring repetition. The repetition occurs when the number of leading zeros in the polar encoder input is large. The leading zeros can be frozen bits, information bits, or a combination of the two.

In certain systems (e.g., NR), information, such as timing index, may be signaled implicitly by permutation of the polar code output, such as by applying cyclic shifts to the output of the polar encoder (e.g., to indicate timing index delta). However, when there is repetition in the polar codewords, the codewords are invariant (e.g., the codewords are identical) even under cyclic shift. Thus, the shift invariance (the two codewords are identical) conflict with the ability to signal implicitly.

In addition, repetition in the polar codewords may lead to false CRC pass determinations. That is a decoder may determine that a received codeword transmission passes a CRC check due to the repeated data. Such a false pass by a decoder can yield erroneous results that can negatively impact communication.

Repetition in polar codewords may also lead to ambiguity in a decoder regarding the aggregation level. For example, an aggregation level 16 for a signal may correspond to two aggregation level 8 signals. In certain cases, such as for control channel transmissions with small payloads, when there is repetition in the codewords the aggregation level may be ambiguous.

Accordingly, some aspects of the present disclosure provide an encoder configured to reduce repetition in polar codes. For example, an encoder may be configured to place cyclic redundancy check (CRC) bits at the beginning (i.e., the start) of a polar codeword. An encoder may further reduce repetition by improving the likelihood that CRC bits are non-zero. In some examples, an encoder may be configured to place reserved bits at the beginning of the polar codeword. Reserved bits may be set to non-zero values or other desired or predetermined values.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (SGTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

New radio (NR) access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antennas, antenna elements arranged or located proximal receiver or transmitter components, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

Example Wireless Communications System

FIG. 1 illustrates an example wireless communication network 100 in which aspects of the present disclosure may be performed. For example, the wireless communication network 100 may be a New Radio (NR) or 5G network. A transmitting device in the wireless communication network 100, such as a base station (BS) 110 or a user equipment (UE) 120 may include a polar encoder for encoding information for certain transmissions and/or channels. The polar encoder (or bit sequencer, or CRC encoder) may place cyclic redundancy (CRC) bits at the beginning (i.e., the start) of the polar encoded bit stream. The polar encoder (or bit sequencer, or CRC encoder) may further ensure, or increase the likelihood, that the CRC bits have non-zero values. The location of the non-zero CRC bits may avoid repetitions of the code words. In turn, this may avoid ambiguity and/or ensure that information may be implicitly signaled via cyclic shifts of non-repeated code words.

As illustrated in FIG. 1, the wireless communication network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a NB subsystem serving this coverage area, depending on the context in which the term is used. In NR systems, the term "cell" and next generation NB (gNB or gNodeB), NR BS, 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless communication network 100 may be a heterogeneous network that includes BSs of different types, e.g., macro BS, pico BS, femto BS, relays, etc. These different types of BSs may have different transmit power levels, different coverage areas, and different impact on interference in the wireless communication network 100. For example, macro BS may have a high transmit power level (e.g., 20 Watts) whereas pico BS, femto BS, and relays may have a lower transmit power level (e.g., 1 Watt).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless communication network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using TDD. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells.

In some examples, access to the air interface may be scheduled, wherein a scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
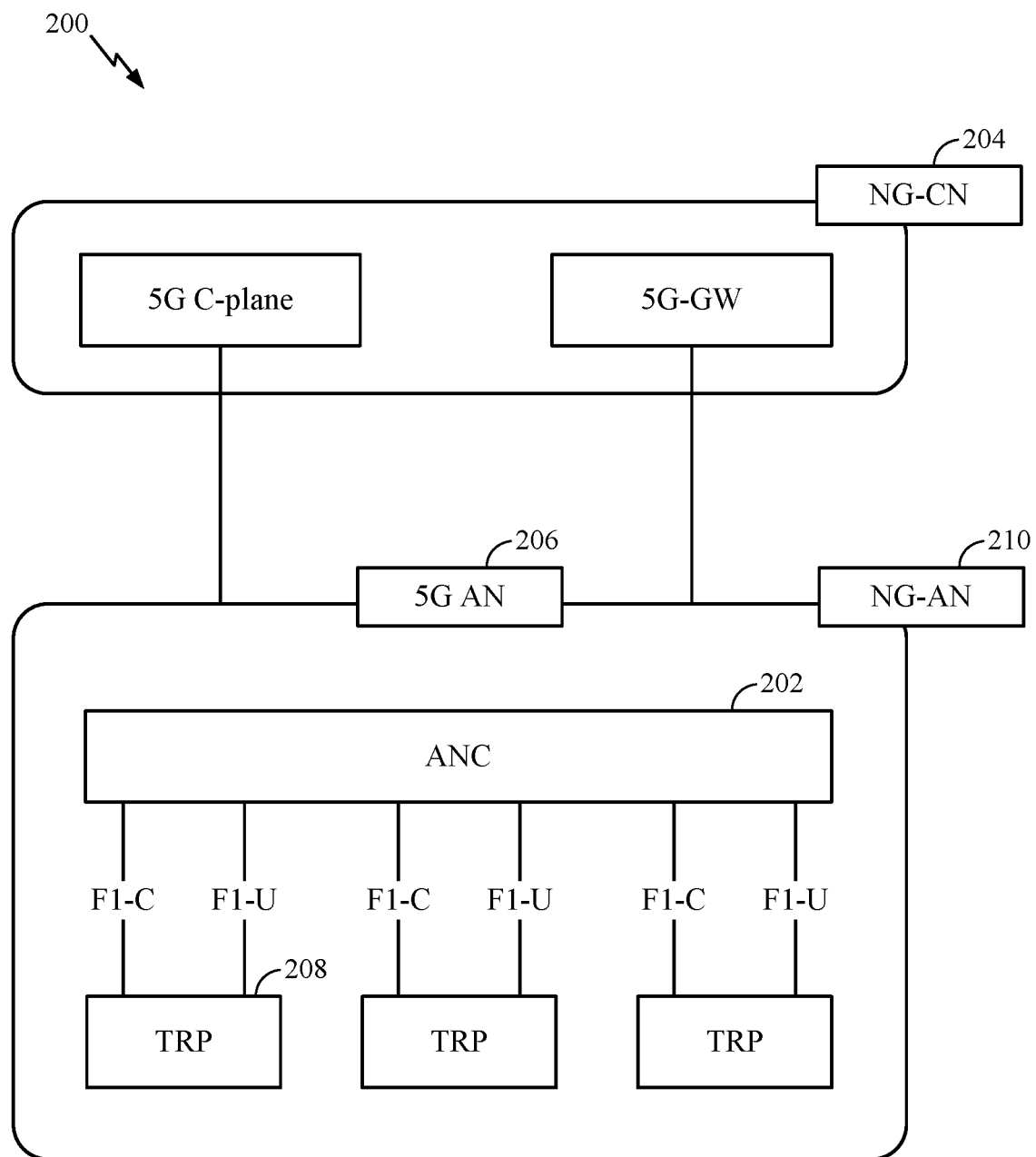
FIG. 2 is a block diagram illustrating an example logical architecture of a distributed radio access network (RAN), in accordance with certain aspects of the present disclosure.

FIG. 2 illustrates an example logical architecture of a distributed Radio Access Network (RAN) 200, which may be implemented in the wireless communication network 100 illustrated in FIG. 1. A 5G access node 206 may include an ANC 202. ANC 202 may be a central unit (CU) of the distributed RAN 200. The backhaul interface to the Next Generation Core Network (NG-CN) 204 may terminate at ANC 202. The backhaul interface to neighboring next generation access Nodes (NG-ANs) 210 may terminate at ANC 202. ANC 202 may include one or more TRPs 208 (e.g., cells, BSs, gNBs, etc.).

The TRPs 208 may be a distributed unit (DU). TRPs 208 may be connected to a single ANC (e.g., ANC 202) or more than one ANC (not illustrated). For example, for RAN sharing, radio as a service (RaaS), and service specific ANC deployments, TRPs 208 may be connected to more than one ANC. TRPs 208 may each include one or more antenna ports. TRPs 208 may be configured to individually (e.g., dynamic selection) or jointly (e.g., joint transmission) serve traffic to a UE.

The logical architecture of distributed RAN 200 may support fronthauling solutions across different deployment types. For example, the logical architecture may be based on transmit network capabilities (e.g., bandwidth, latency, and/or jitter).

The logical architecture of distributed RAN 200 may share features and/or components with LTE. For example, next generation access node (NG-AN) 210 may support dual connectivity with NR and may share a common fronthaul for LTE and NR.

The logical architecture of distributed RAN 200 may enable cooperation between and among TRPs 208, for example, within a TRP and/or across TRPs via ANC 202. An inter-TRP interface may not be used.

Logical functions may be dynamically distributed in the logical architecture of distributed RAN 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU (e.g., TRP 208) or CU (e.g., ANC 202).

Figure 3:
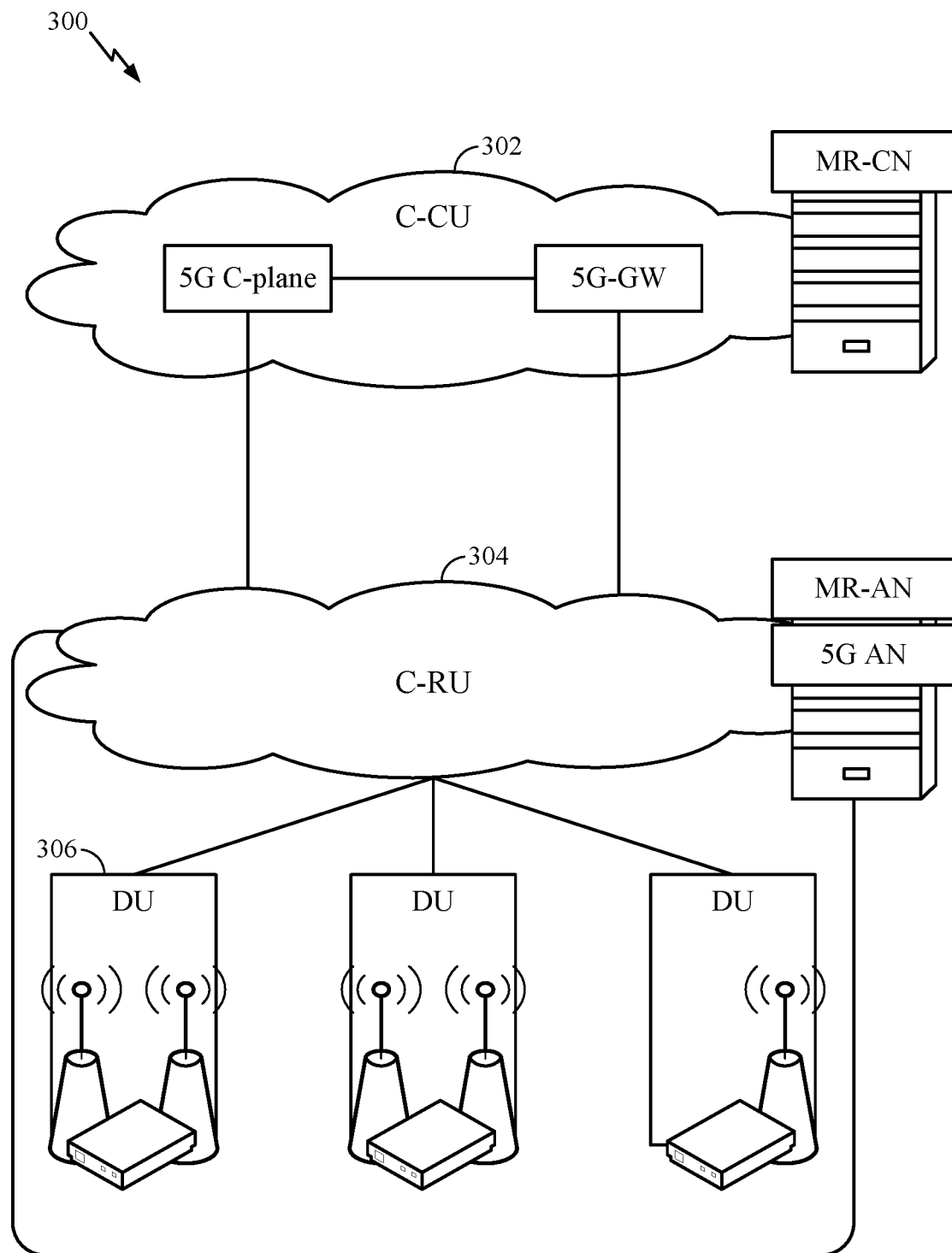
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. C-CU 302 may be centrally deployed. C-CU 302 functionality may be offloaded (e.g., to advanced wireless services (AWS)), in an effort to handle peak capacity.

A centralized RAN unit (C-RU) 304 may host one or more ANC functions. Optionally, the C-RU 304 may host core network functions locally. The C-RU 304 may have distributed deployment. The C-RU 304 may be close to the network edge.

A DU 306 may host one or more TRPs (Edge Node (EN), an Edge Unit (EU), a Radio Head (RH), a Smart Radio Head (SRH), or the like). The DU may be located at edges of the network with radio frequency (RF) functionality.

Figure 4:
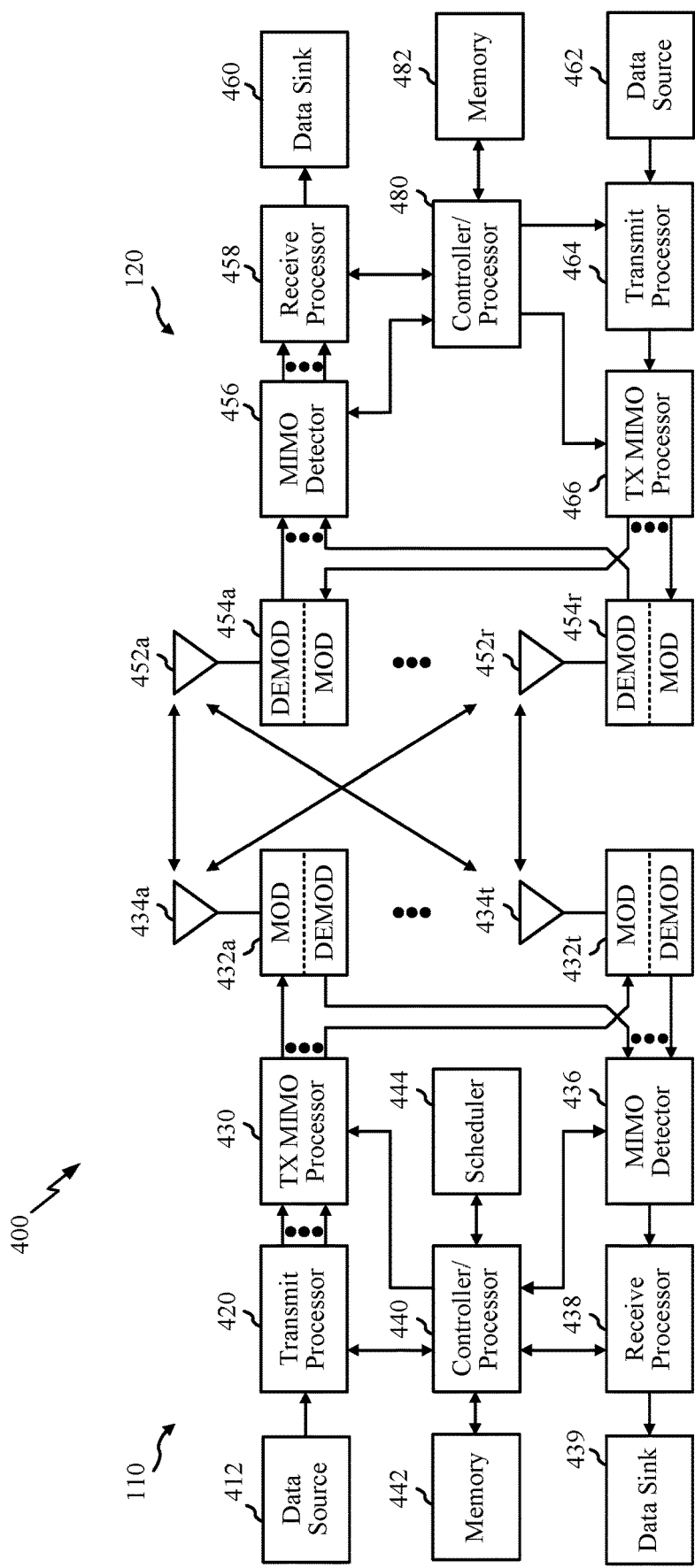
FIG. 4 is a block diagram conceptually illustrating a design of an example base station (BS) and user equipment (UE), in accordance with certain aspects of the present disclosure.

FIG. 4 illustrates example components of BS 110 and UE 120 (as depicted in FIG. 1), which may be used to implement aspects of the present disclosure. For example, antennas 452, processors 466, 458, 464, and/or controller/processor 480 of the UE 120 and/or antennas 434, processors 420, 460, 438, and/or controller/processor 440 of the BS 110 may be used to perform the various techniques and methods described herein for reducing repetitions of code words for polar codes.

At the BS 110, a transmit processor 420 may receive data from a data source 412 and control information from a controller/processor 440. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 420 may process (e.g., encode and symbol map) the data and control information to obtain data symbols and control symbols, respectively. The processor 420 may also generate reference symbols, e.g., for the primary synchronization signal (PSS), secondary synchronization signal (SSS), and cell-specific reference signal (CRS). A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) in transceivers 454a through 454r, respectively. Each demodulator 454 may condition (e.g., filter, amplify, downconvert, and digitize) a respective received signal to obtain input samples. Each demodulator may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at UE 120, a transmit processor 464 may receive and process data (e.g., for the physical uplink shared channel (PUSCH)) from a data source 462 and control information (e.g., for the physical uplink control channel (PUCCH) from the controller/processor 480. The transmit processor 464 may also generate reference symbols for a reference signal (e.g., for the sounding reference signal (SRS)). The symbols from the transmit processor 464 may be precoded by a TX MIMO processor 466 if applicable, further processed by the demodulators in transceivers 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the BS 110 and the UE 120, respectively. The processor 440 and/or other processors and modules at the BS 110 may perform or direct the execution of processes for the techniques described herein. The memories 442 and 482 may store data and program codes for BS 110 and UE 120, respectively. A scheduler 444 may schedule UEs for data transmission on the downlink and/or uplink.

Figure 5:
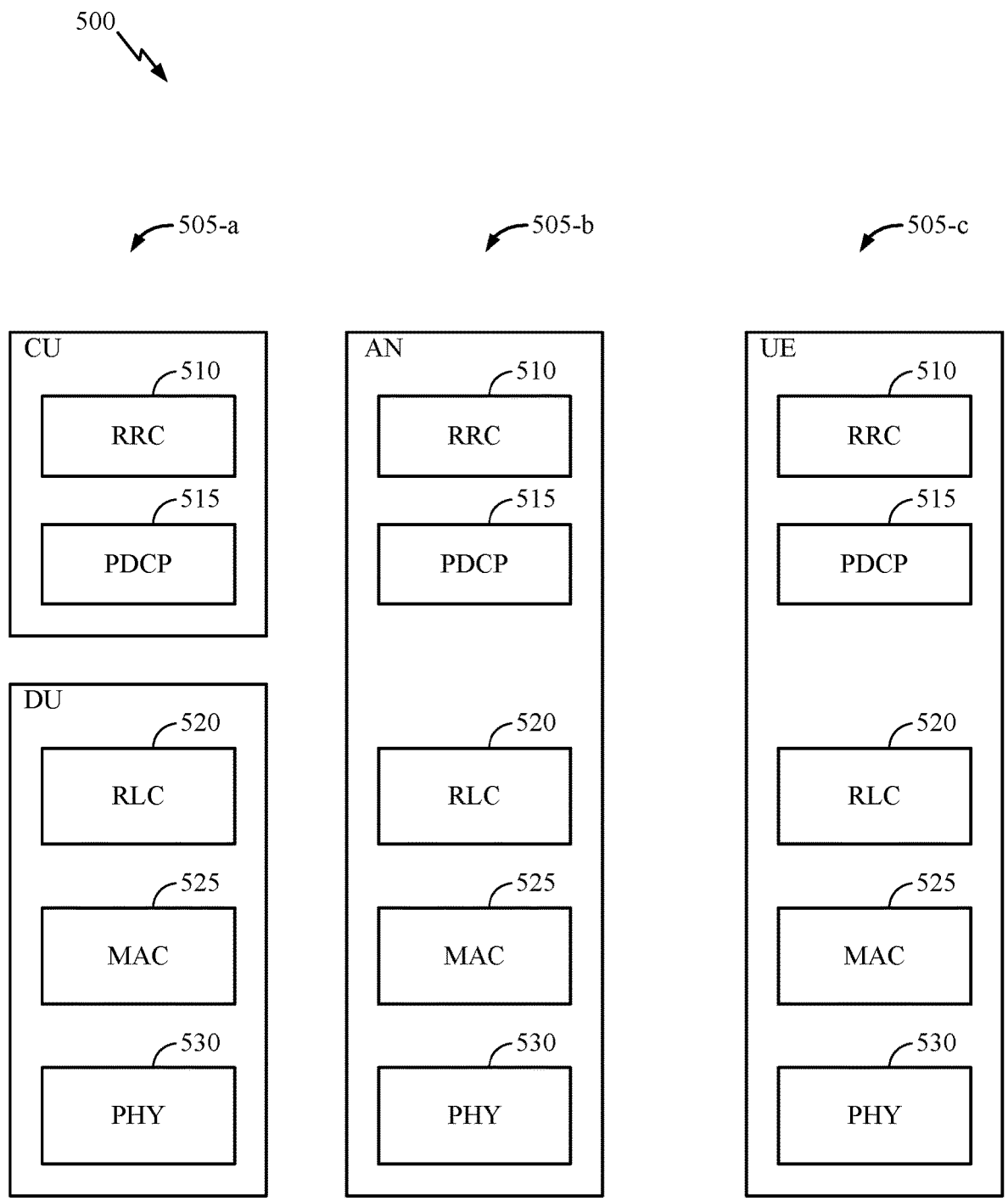
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a wireless communication system, such as a 5G system (e.g., a system that supports uplink-based mobility). Diagram 500 illustrates a communications protocol stack including a RRC layer 510, a PDCP layer 515, a RLC layer 520, a MAC layer 525, and a PHY layer 530. In various examples, the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device. In the second option, RRC layer 510, PDCP layer 515, RLC layer 520, MAC layer 525, and PHY layer 530 may each be implemented by the AN. The second option 505-b may be useful in, for example, a femto cell deployment.

Regardless of whether a network access device implements part or all of a protocol stack, a UE may implement an entire protocol stack as shown in 505-c (e.g., the RRC layer 510, the PDCP layer 515, the RLC layer 520, the MAC layer 525, and the PHY layer 530).

In LTE, the basic transmission time interval (TTI) or packet duration is the 1 ms subframe. In NR, a subframe is still 1 ms, but the basic TTI is referred to as a slot. A subframe contains a variable number of slots (e.g., 1, 2, 4, 8, 16, . . . slots) depending on the subcarrier spacing. The NR RB is 12 consecutive frequency subcarriers. NR may support a base subcarrier spacing of 15 KHz and other subcarrier spacing may be defined with respect to the base subcarrier spacing, for example, 30 kHz, 60 kHz, 120 kHz, 240 kHz, etc. The symbol and slot lengths scale with the subcarrier spacing. The CP length also depends on the subcarrier spacing.

Figure 6:
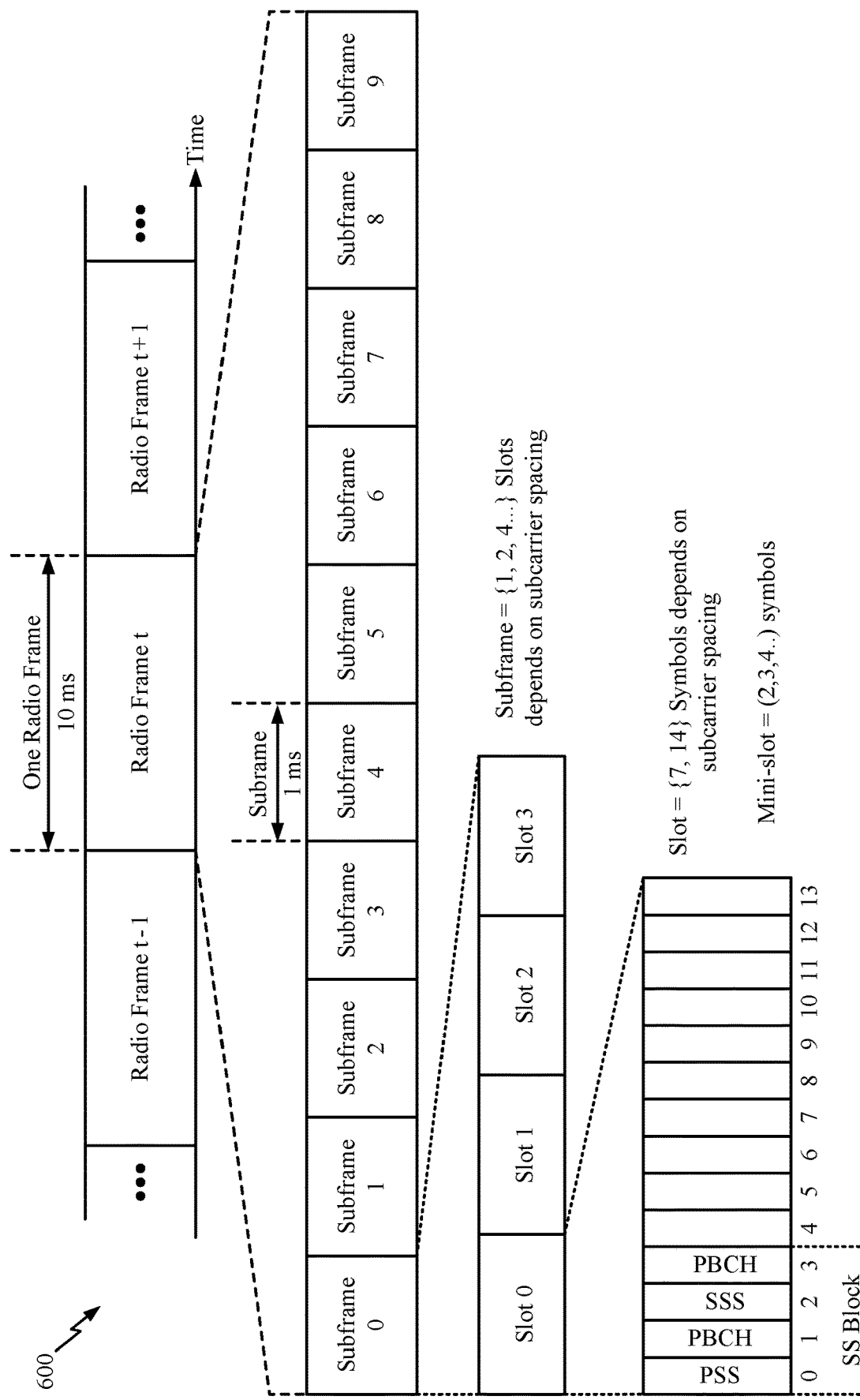
FIG. 6 illustrates an example of a frame format for a new radio (NR) system, in accordance with certain aspects of the present disclosure.

FIG. 6 is a diagram showing an example of a frame format 600 for NR. The transmission timeline for each of the downlink and uplink may be partitioned into units of radio frames. Each radio frame may have a predetermined duration (e.g., 10 ms) and may be partitioned into 10 subframes, each of 1 ms, with indices of 0 through 9. Each subframe may include a variable number of slots depending on the subcarrier spacing. Each slot may include a variable number of symbol periods (e.g., 7 or 14 symbols) depending on the subcarrier spacing. The symbol periods in each slot may be assigned indices. A mini-slot is a subslot structure (e.g., 2, 3, or 4 symbols).

Each symbol in a slot may indicate a link direction (e.g., DL, UL, or flexible) for data transmission and the link direction for each subframe may be dynamically switched. The link directions may be based on the slot format. Each slot may include DL/UL data as well as DL/UL control information.

In NR, a synchronization signal (SS) block is transmitted. The SS block includes a PSS, a SSS, and a two symbol PBCH. The SS block can be transmitted in a fixed slot location, such as the symbols 0-3 as shown in FIG. 6. The PSS and SSS may be used by UEs for cell search and acquisition. The PSS may provide half-frame timing, the SS may provide the CP length and frame timing. The PSS and SSS may provide the cell identity. The PBCH carries some basic system information (SI), such as downlink system bandwidth, timing information within radio frame, SS burst set periodicity, system frame number, etc. The SS blocks may be organized into SS bursts to support beam sweeping.

Further system information such as, remaining minimum system information (RMSI), system information blocks (SIBs), other system information (OSI) can be transmitted on a PDSCH in certain subframes.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Polar Codes

Polar codes may be used to encode a stream of bits for transmission. Polar codes are a capacity-achieving coding scheme with almost linear (in block length) encoding and decoding complexity. Polar codes have many desirable properties such as deterministic construction (e.g., based on a fast Hadamard transform), very low and predictable error floors, and simple successive-cancellation (SC) based decoding.

Polar codes are linear block codes of length $N=2^n$ where their generator matrix is constructed using the $n^{th}$ Kronecker power of the matrix $$G = \begin{pmatrix} 1 & 0 \\ 1 & 1 \end{pmatrix},$$

denoted by $G^n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

A codeword may be generated by using the generator matrix to encode a number of input bits (e.g., information bits). For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched and transmitted.

When the received vectors are decoded using a Successive Cancellation (SC) decoder (e.g., decoder 816), every estimated bit, $\hat{u}_i$, has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N−K) bits to a predetermined value, such as 0, for example as explained below.

For very large N, polar codes transform the channel into N parallel "virtual" channels for the N information bits. If C is the capacity of the channel, then there are almost N*C channels which are completely noise free and there are N(1−C) channels which are completely noisy. The basic polar coding scheme then involves freezing (i.e., not transmitting) the information bits to be sent along the completely noisy channel and sending information only along the perfect channels. For short-to-medium N, this polarization may not be complete in the sense there could be several channels which are neither completely useless nor completely noise free (i.e., channels that are in transition). Depending on the rate of transmission, these channels in the transition are either frozen or they are used for transmission.

In NR as described above, Polar codes may be used to encode information. For example, Polar codes may be used as forward error correction (FEC) for control channels (e.g., 5G control channels). Generally, cyclic redundancy check (CRC) bits can be added in the Polar codes (e.g., CRC-aided polar coding (CA-polar)) to improve the error rate performance and error detection. Generally, other types of "assistant bits" can also be used.

Because Polar codes are linear block codes with a recursively constructed generator matrix, a polar code of length N is built from the concatenation of two constituent polar codes of length $N_v=N/2$. This recursive construction is carried out in a way that polarizes the probability of correctly estimating bits: some bit estimates become more reliable and others become less reliable. As the blocklength increases, some bit estimates become more reliable and the rest become less reliable.

Each polar code bit-channel (e.g., channel index) is assigned a reliability value, used to determine which bits transmit information and which parity. Relative reliabilities may be known (e.g., stored and/or computed) by both encoders and decoders. The relative order of reliabilities can be dependent on the code length and on the signal-to-noise ratio (SNR) for which the code has been constructed. The reliabilities associated with the bit-channels can be determined, for example, by using the Bhattacharyya parameter, through the direct use of probability functions, or other reliability computation.

In Polar encoding, the most reliable channels (e.g., most reliable bit locations/positions) are typically selected to carry information (e.g., information bits), and the rest of the bits are set as a fixed value (e.g., 0). These fixed bits may be referred to as frozen bits. However if some of the frozen bits are selected having values that depend on the information bits, the performance can be improved.

Figure 7:
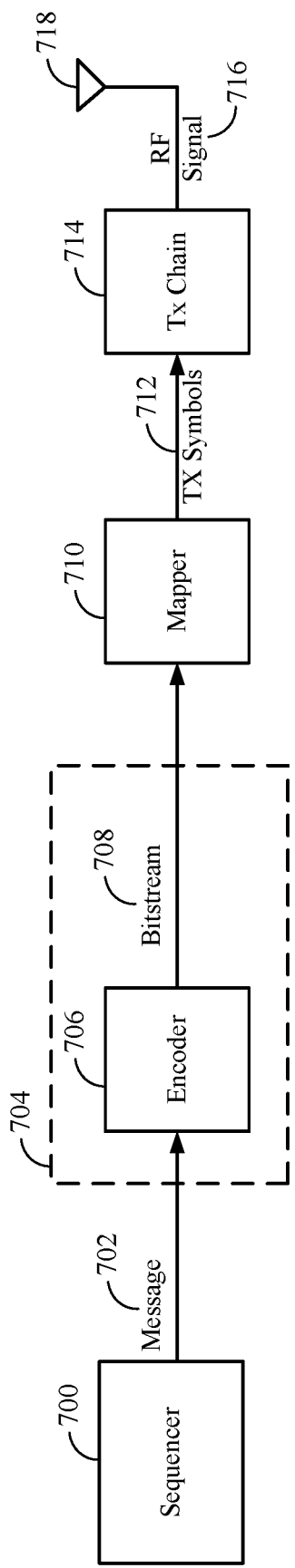
FIG. 7 is a block diagram illustrating an encoder, in accordance with certain aspects of the present disclosure.

FIG. 7 is a simplified block diagram illustrating an encoder, in accordance with certain aspects of the present disclosure. FIG. 7 illustrates a portion of a radio frequency (RF) modem 704 that may be configured to provide an encoded message for wireless transmission (e.g., using Polar codes). In one example, an encoder 706 in a BS (e.g., BS 110) or a UE (e.g., UE 120) on the reverse path receives a message 702 for transmission. The message 702 may contain data and/or encoded voice or other content directed to the receiving device. In aspects, the message 702 is first input into a sequencer 700 that receives the message 702 and output the message 702 as a sequence of bits in a channel index order. In aspects, the sequencer 700 determines the channel index order for the sequence of bits. The encoder 706 encodes the message using a suitable modulation and coding scheme (MCS), typically selected based on a configuration defined by the BS 110 or another network entity. In some cases, the encoder 706 may select, from a set of rate codes, a rate code to be used to encode the message. The encoded bitstream 708 may then be stored in circular buffer and rate-matching may be performed on the stored encoded bitstream, for example, according to aspects presented below. After the encoded bitstream 708 is rate-matched, the encoded bitstream 708 may then be provided to a mapper 710 that generates a sequence of Tx symbols 712 that are modulated, amplified and otherwise processed by Tx chain 714 to produce an RF signal 716 for transmission through antenna 718.

Figure 8:
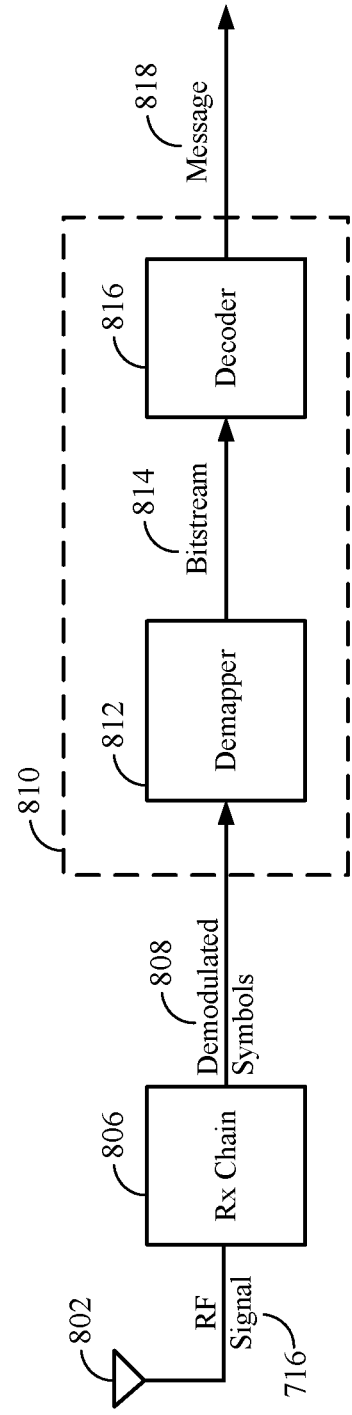
FIG. 8 is a block diagram illustrating a decoder, in accordance with certain aspects of the present disclosure.

FIG. 8 is a simplified block diagram illustrating a decoder, in accordance with certain aspects of the present disclosure. FIG. 8 illustrates a portion of a RF modem 810 that may be configured to receive and decode a wirelessly transmitted signal including an encoded message (e.g., a message encoded using a Polar code). In various examples, the modem 810 receiving the signal may reside at the UE, at the BS, or at any other suitable apparatus or means for carrying out the described functions. An antenna 802 provides an RF signal 716 (i.e., the RF signal produced in FIG. 4) to a UE (e.g., UE 120). An Rx chain 806 processes and demodulates the RF signal 716 and may provide a sequence of demodulated symbols 808 to a demapper 812, which produces a bitstream 814 representative of the encoded message.

A decoder 816 may then be used to decode m-bit information strings from a bitstream that has been encoded using a coding scheme (e.g., a Polar code). The decoder 816 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 814. The bitstream 814 may be decoded based on a statistical analysis of LLRs calculated for the bitstream 814. In one example, a Viterbi decoder may compare and select the correct Viterbi path that defines a sequence of signaling states using a likelihood ratio test to generate LLRs from the bitstream 814. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 814. The decoder 816 may then decode the bitstream 814 based on the LLRs to determine the message 818 containing data and/or encoded voice or other content transmitted from the base station (e.g., BS 110).

Example Encoder for Reducing Repetition in Polar Codes

In certain systems, for example such as new radio (NR) or 5G systems as discussed above, polar coding is used for encoding and decoding of certain signals, channels, etc. In some examples, polar codes may be used for enhanced mobile broadband (eMBB) service downlink control channels. In some examples, polar codes may be used for the physical broadcast channel (PBCH). The polar codes may have naturally occurring repetition. The repetition occurs when the number of leading zeros in the polar encoder input is large. The leading zeros can be frozen bits, information bits, or a combination of the two.

In certain systems (e.g., NR), some information, such as timing index (e.g., such as the synchronization signal block (SSB) index), may be signaled implicitly by permutation of the polar code output, such as by applying cyclic shifts (e.g., N/4) to the output of the polar encoder (e.g., to indicate timing index delta). However, when there is repetition in the polar codewords, the codewords are invariant (e.g., the codewords are identical) even under cyclic shift. For example, when the first $N-N/2^i$ bits in the U domain (i.e., the bit stream $u=u_0, u_1, \ldots, u_{N-1}$) are zeros ($0 \leq i \leq \log_2 N$) the polar codeword contains repetition with a periodicity of $2^i$. Such a scenario may occur, for example, for low-rate codes.

Figure 9:
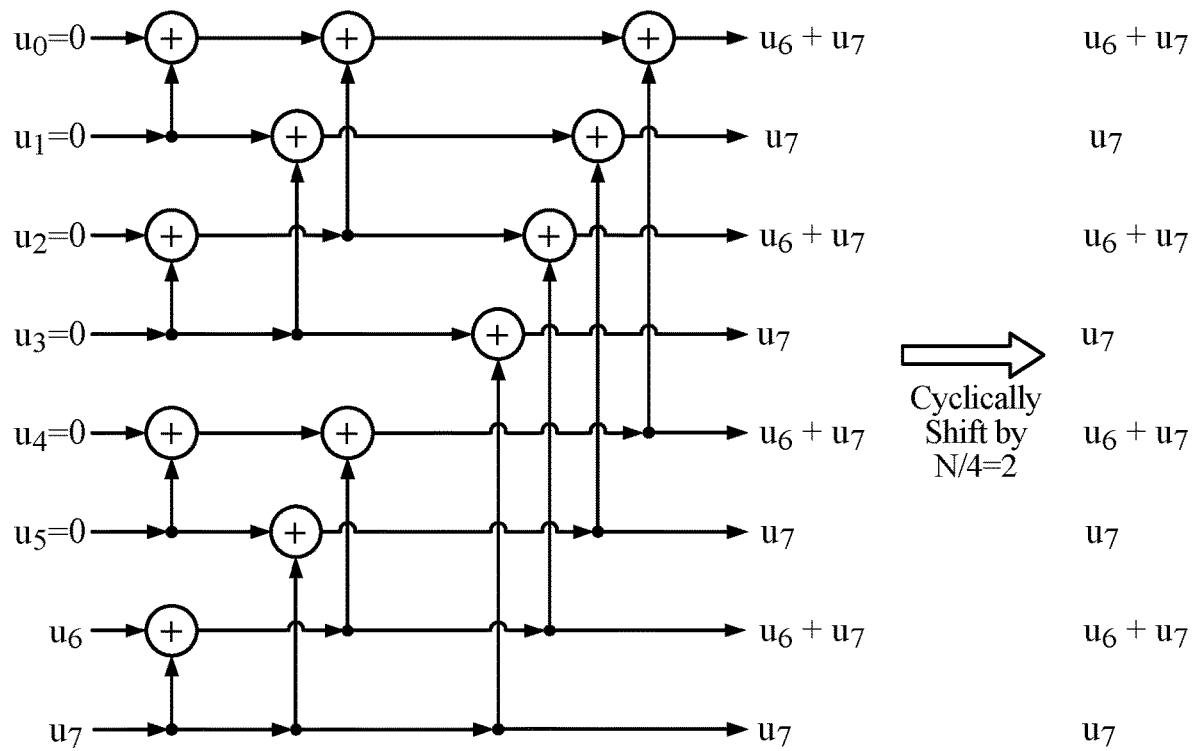
FIG. 9 is a diagram illustrating repetitions in polar codes.

FIG. 9 is a diagram illustrating repetitions in polar codes. In the example in FIG. 9, N=8, and $u_0$, $u_1$ $u_2$, and $u_4$ are frozen bits (i.e., 0), and $u_3$, $u_5$, $u_6$, $u_7$ are information bits equal to zero. The bits flow from left-to-right and from bottom-to-top in the diagram shown in FIG. 9, thus, the output of each XOR operation is the XOR of the bit to the left and the bit to the bottom. As shown in FIG. 9, the output of the polar is periodic and, therefore, invariant under the cyclic shift.

Shift invariance can occur when two cyclically-shifted codewords are identical. Given identical, copied states, implicit signaling can be affected presenting a conflict with the ability to signal implicitly. The shift invariance may also lead to false CRC pass determinations at or by the decoder. For example, the decoder may pass CRC for multiple cyclic shifts of the codeword. In addition, the repetition in the polar codewords may lead to aggregation level ambiguity. For example, an aggregation level 16 for a signal may correspond to two aggregation level 8 signals. Thus, in some examples, such as for control channel transmissions with small payloads, when there is repetition in the codewords the aggregation level may be ambiguous.

Accordingly, aspects of the present disclosure provide an improved encoder configured to reduce repetition in polar codes. For example, the encoder may include encoder circuitry configured to place cyclic redundancy check (CRC) bits at the beginning of the polar code. The encoder may further reduce repetition by improving the likelihood that the CRC bits are non-zero. Circuit configurations may vary as desired or as inspired by overall form factor or other operational design details. Some or all of the CRC bits can be placed before the information bits in the polar codeword. The CRC is unlikely to be all zero, for example, compared to the likelihood that the initial portion of the payload (i.e., the beginning of the polar codeword, or the polar encoded information bits) is zero. In some embodiments, reducing the number of leading zeros is preferred. But there might be cases where ensuring a non-zero CRC is not practical or possible. Accordingly, in such embodiments, polar code techniques may include options where one or more initial information bits are non-zero.

According to certain aspects, some or all of the CRC bits placed at the beginning of the codeword can be set to a non-zero value to further reduce the probability of repetition. In some examples, the CRC may be scrambled. In some examples, the CRC can be set to an initial non-zero remainder (or non-zero register content) so that the CRC is non-zero. In some examples, the CRC values can be masked using a non-zero mask to set (or ensure) that the CRC bits placed at the beginning of the codeword are not 0's.

In some examples, the CRC bits are set to non-zero values only if the first bits (or a subset of the initial bits) at the beginning of the payload are zero. By ordering the payload in this way, the number of leading zeros is minimized. For example, if the information bits are zero, then the CRC is non-zero and if the information bits are non-zero, then the CRC may be zero.

According to certain aspects, the encoding device (i.e., the transmitting device, such as a base station (BS)), can set the CRC bits at the beginning of the codeword to non-zero values by changing the values of some reserved bits of transport block (e.g., the information vector input to the encoder). In some examples, the master information block (MIB) has some reserved bits (e.g., reserved fields). The encoding device can change the values of the reserved fields to manipulate the CRC, for example, to ensure (or increase the probability) that some of the CRC bits at the beginning of the codeword have non-zero values. In some examples, the encoding device may check whether the generated codeword is identical to its cyclic-shifted version (which could result in a false CRC pass).

According to certain aspects, the transmitting device can reduce repetition in the polar codewords by placing one or more of the reserved bits at the beginning of the codeword (e.g., instead of or in addition to the CRC bits) and setting one or more of the reserved bits values to a non-zero value.

According to certain aspects, if the decoding device (e.g., a user equipment) passes CRC for multiple cyclic-shifts of the codeword, the decoding may verify the CRC passes. The decoding device may take as candidates all TBs obtained, by undoing the cyclic shifts that passed CRC and using other information to determine if one of those TBs is valid. The decoding device may also discard all those TBs.

Figure 10:
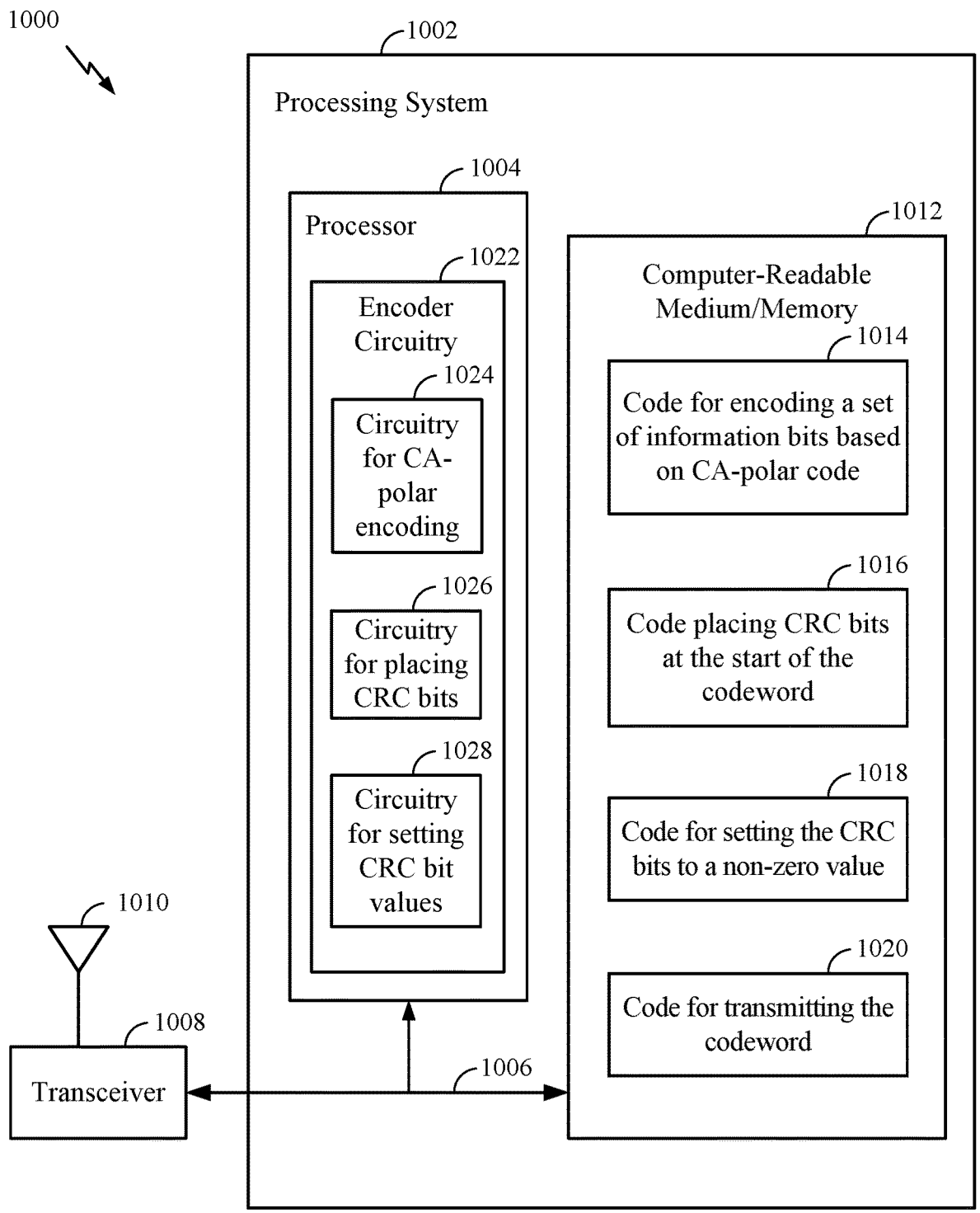
FIG. 10 illustrates a communications device that may include various components configured to perform operations for the techniques disclosed herein, in accordance with aspects of the present disclosure.
Figure 11:
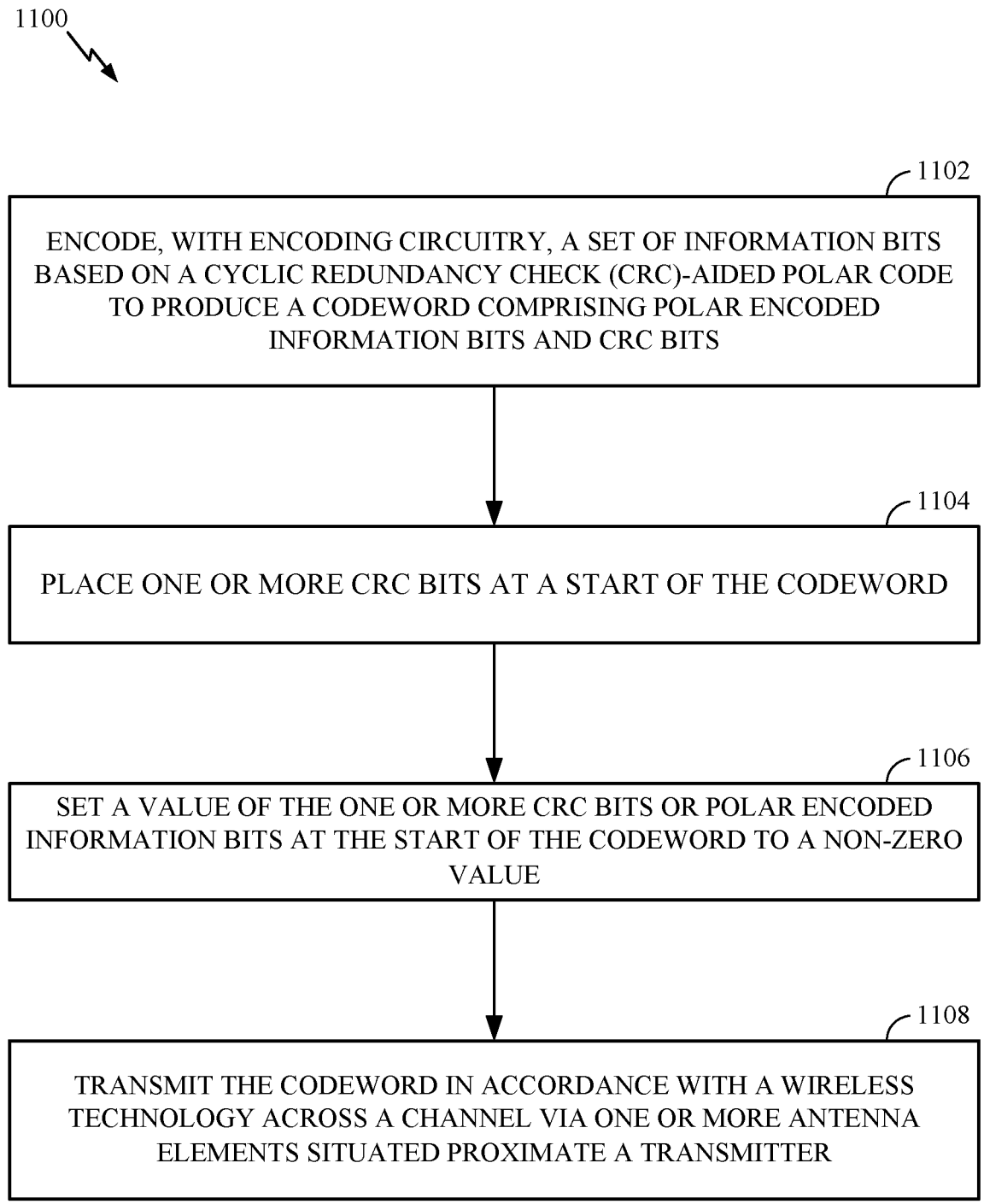
FIG. 11 is a flow chart illustrating example operations for reducing repetitions in polar codes, in accordance with certain aspects of the present disclosure.

FIG. 10 illustrates a communications device 1000 that may include various components (e.g., corresponding to means-plus-function components) configured to perform operations for the techniques disclosed herein, such as the operations illustrated in FIG. 11. The communications device 1000 includes a processing system 1002 coupled to a transceiver 1008. The transceiver 1008 is configured to transmit and receive signals for the communications device 1000 via an antenna 1010 (which may be one or more antenna elements), such as the various signals as described herein. The transceiver 1008 is configured to transmit the signals in accordance with a wireless technology. The processing system 1002 may be configured to perform processing functions for the communications device 1000, including processing signals received and/or to be transmitted by the communications device 1000.

The processing system 1002 includes a processor 1004 coupled to a computer-readable medium/memory 1012 via a bus 1006. In certain aspects, the computer-readable medium/memory 1012 is configured to store instructions (e.g., computer executable code) that when executed by the processor 1004, cause the processor 1004 to perform the operations illustrated in FIG. 11, or other operations for performing the various techniques discussed herein for reducing repetition in polar codewords. In certain aspects, computer-readable medium/memory 1012 stores code 1014 for encoding a set of information bits based on CA-polar code; code 1016 for placing CRC bits at the start of the codeword; code 1018 for setting the CRC bits to a non-zero value; and code 1020 for transmitting the codeword.

The processor 1004 includes encoder circuitry 1022. The encoder circuitry 1022 may include circuitry 1024 for CA-polar encoding; circuitry 1026 for placing CRC (e.g., at the start of the codeword); and circuitry 1028 for setting CRC bit values. The circuitry 1028 for setting the CRC bits values may include various circuitry for setting the CRC bits values as discussed herein, including, for example, setting the initial CRC remainder, masking the CRC bits, and/or manipulating the reserved bits. The encoder circuitry 1022 may include additional circuitry configured to implement other aspects described herein.

FIG. 11 is a flow chart illustrating example operations 1100 for reducing repetitions in polar codes, in accordance with certain aspects of the present disclosure. The operations 1100 may be performed by a transmitting device (e.g., such as a BS 110 illustrated in the example wireless communication network 100 in FIG. 1).

The operations 1100 include, at 1102, encoding, with encoding circuitry, a set of information bits based on a CRC-aided polar code to produce a codeword including polar encoded information bits and CRC bits.

At 1104, the transmitting devices places one or more of the CRC bits at a start of the codeword.

At 1106, the transmitting device sets a value of the one or more CRC bits to a non-zero value. In some examples, the transmitting device sets values of the one or more CRC bits to the non-zero value based on a determination that one or more of the polar encoded information bits at a start of the codeword, following the CRC bits, are zero. In some examples, the transmitting device sets an initial remainder of the CRC to a non-zero value. In some examples, the transmitting device masks the value of the one or more CRC bits with a non-zero mask. In some examples, the transmitting device changes a value of one or more reserved bits (e.g., reserved fields of a MIB).

According to certain aspects, the transmitting device may apply a cyclic shift to the codeword after setting the value of the one or more CRC bits to the non-zero value. The cyclic shift may implicitly indicate information (e.g., timing information) associated with the transmission.

At 1108, the transmitting device transmits the codeword in accordance with a wireless technology across a channel (e.g., PBCH) via one or more antenna elements situated proximate a transmitter.

According to certain aspects, a receiving device (e.g., such as a UE 120 in the example wireless communication network 100 shown in FIG. 1) may perform complementary operations to the operations 1100 by the transmitting device, for decoding the polar codeword with reduced repetition. In some examples, the receiving device may determine the additional information (e.g., such as the timing information)

based on the cyclic-shift, determine CRC passes, and/or determine aggregation level of the transmission.

The communication techniques discussed herein involving polar codewords with reduced repetition may allow for implicit signaling of additional information, without increasing the payload size, thereby improving the processing speed and efficiency of communication devices. The communication techniques discussed herein may also help reduce false CRC pass detection by decoding devices. The communication techniques discussed herein may resolve ambiguity regarding the aggregation level of transmitted signals.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files.

Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 11.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communication, comprising:
   at least one processor coupled with a memory and comprising at least one encoder circuit configured to:
      encode a set of information bits based on a cyclic redundancy check (CRC)-aided polar code to produce a codeword comprising polar encoded information bits and CRC bits;
      place one or more of the CRC bits at a start of the codeword; and
      set a value of the one or more CRC bits to a non-zero value; and
   a transmitter configured to transmit the codeword.

2. The apparatus of claim 1, wherein the encoder circuit is configured to set the value of the one or more CRC bits to the non-zero value based on a determination that one or more of the polar encoded information bits at a start of the codeword, following the CRC bits, are zero.

3. The apparatus of claim 1, wherein the encoder circuit is configured to set the value of the one or more CRC bits by setting an initial remainder of the CRC to a non-zero value.

4. The apparatus of claim 1, wherein the encoder circuit is configured to set the value of the one or more CRC bits by masking the value of the one or more CRC bits with a non-zero mask.

5. The apparatus of claim 1, wherein:
   the set of information bits comprises one or more reserved bits; and
   the encoder circuit is configured to set the value of the one or more CRC bits by changing a value of one or more of the one or more reserved bits.

6. The apparatus of claim 1, wherein the one or more reserved bits comprises reserved fields of a master information block (MIB).

7. The apparatus of claim 1, wherein the channel comprises a downlink control channel.

8. The apparatus of claim 1, wherein the encoder circuit is configured to apply a cyclic shift to the codeword after setting the value of the one or more CRC bits to the non-zero value.

9. The apparatus of claim 8, wherein the encoder circuit is configured to apply the cyclic shift to implicitly indicate information associated with the transmission.

10. A method for wireless communication, comprising:
   encoding, with encoding circuitry, a set of information bits based on a cyclic redundancy check (CRC)-aided polar code to produce a codeword comprising polar encoded information bits and CRC bits;
   placing one or more of the CRC bits at a start of the codeword;
   setting a value of the one or more CRC bits to a non-zero value; and
   transmitting the codeword.

11. The method of claim 10, wherein setting the value of the one or more CRC bits to the non-zero value is based on a determination that one or more of the polar encoded information bits at a start of the codeword, following the CRC bits, are zero.

12. The method of claim 10, wherein setting the value of the one or more CRC bits comprises setting an initial remainder of the CRC to a non-zero value.

13. The method of claim 10, wherein setting the value of the one or more CRC bits comprises masking the value of the one or more CRC bits with a non-zero mask.

14. The method of claim 10, wherein:
the set of information bits comprises one or more reserved bits; and
setting the value of the one or more CRC bits comprises changing a value of one or more of the one or more reserved bits.

15. The method of claim 10, wherein the one or more reserved bits comprises reserved fields of a master information block (MIB).

16. The method of claim 10, wherein the channel comprises a downlink control channel.

17. The method of claim 10, further comprising applying a cyclic shift to the codeword after setting the value of the one or more CRC bits to the non-zero value.

18. The method of claim 17, wherein applying the cyclic shift comprises applying the cyclic shift to implicitly indicate information associated with the transmission.

19. An apparatus for wireless communication, comprising:
means for encoding a set of information bits based on a cyclic redundancy check (CRC)-aided polar code to produce a codeword comprising polar encoded information bits and CRC bits;
means for placing one or more of the CRC bits at a start of the codeword;
means for setting a value of the one or more CRC bits to a non-zero value; and
means for transmitting the codeword.

20. The apparatus of claim 19, wherein setting the value of the one or more CRC bits to the non-zero value is based on a determination that one or more of the polar encoded information bits at a start of the codeword, following the CRC bits, are zero.

21. The apparatus of claim 19, wherein means for setting the value of the one or more CRC bits comprises means for setting an initial remainder of the CRC to a non-zero value.

22. The apparatus of claim 19, wherein means for setting the value of the one or more CRC bits comprises means for masking the value of the one or more CRC bits with a non-zero mask.

23. The apparatus of claim 19, wherein:
the set of information bits comprises one or more reserved bits; and
means for setting the value of the one or more CRC bits comprises means for changing a value of one or more of the one or more reserved bits.

24. The apparatus of claim 19, wherein the one or more reserved bits comprises reserved fields of a master information block (MIB).

25. The apparatus of claim 19, wherein the channel comprises a downlink control channel.

26. The apparatus of claim 19, further comprising means for applying a cyclic shift to the codeword after setting the value of the one or more CRC bits to the non-zero value.

27. The apparatus of claim 26, wherein means for applying the cyclic shift comprises means for applying the cyclic shift to implicitly indicate information associated with the transmission.

28. A non-transitory computer readable medium having computer executable codes stored thereon for wireless communication, when the codes are executed by a computer to cause the computer to perform:
encoding a set of information bits based on a cyclic redundancy check (CRC)-aided polar code to produce a codeword comprising polar encoded information bits and CRC bits;
placing one or more of the CRC bits at a start of the codeword;
setting a value of the one or more CRC bits to a non-zero value; and
transmitting the codeword.

29. The non-transitory computer readable medium of claim 28, wherein setting the value of the one or more CRC bits comprises setting an initial remainder of the CRC to a non-zero value or code for masking the value of the one or more CRC bits with a non-zero mask.

30. The non-transitory computer readable medium of claim 28, wherein:
the set of information bits comprises one or more reserved bits; and
setting the value of the one or more CRC bits comprises changing a value of one or more of the one or more reserved bits.

* * * * *